United States Patent
Yoshida

(10) Patent No.: US 9,212,853 B2
(45) Date of Patent: Dec. 15, 2015

(54) COOLER

(75) Inventor: Tadafumi Yoshida, Kasugai (JP)

(73) Assignee: TOYOTA JIDOSHA KABUSHIKI KAISHA, Toyota-Shi (JP)

( * ) Notice: Subject to any disclaimer, the term of this patent is extended or adjusted under 35 U.S.C. 154(b) by 0 days.

(21) Appl. No.: 13/879,075

(22) PCT Filed: Dec. 24, 2010

(86) PCT No.: PCT/JP2010/073340
§ 371 (c)(1),
(2), (4) Date: Apr. 12, 2013

(87) PCT Pub. No.: WO2012/086058
PCT Pub. Date: Jun. 28, 2012

(65) Prior Publication Data
US 2013/0206375 A1 Aug. 15, 2013

(51) Int. Cl.
| | |
|---|---|
| *F28F 3/04* | (2006.01) |
| *F28F 3/12* | (2006.01) |
| *F28F 3/02* | (2006.01) |
| *H01L 23/473* | (2006.01) |
| *H05K 7/20* | (2006.01) |

(52) U.S. Cl.
CPC . *F28F 3/02* (2013.01); *F28F 3/022* (2013.01); *F28F 3/048* (2013.01); *F28F 3/12* (2013.01); *H01L 23/473* (2013.01); *H05K 7/20927* (2013.01); *H01L 2924/0002* (2013.01)

(58) Field of Classification Search
CPC ............ F25D 9/00; H01L 23/473; F28F 3/02; H05K 7/20927; H05K 7/20881; H05K 7/20627; H05K 7/20254; H05K 7/20272
USPC ............ 165/80.4, 104.33, 175; 361/699, 700; 257/714
See application file for complete search history.

(56) References Cited

U.S. PATENT DOCUMENTS

| 8,167,030 B2 * | 5/2012 | Kolb et al. ..................... 165/170 |
| 2008/0169088 A1 * | 7/2008 | Aoki et al. ............... 165/104.19 |

(Continued)

FOREIGN PATENT DOCUMENTS

| CN | 101868854 A | 10/2010 |
| JP | 2003-224238 A | 8/2003 |
| JP | 2005-011983 A | 1/2005 |

(Continued)

OTHER PUBLICATIONS

Machine Translation of JP2005011983A, pp. 1-5.*

*Primary Examiner* — Tho V Duong
(74) *Attorney, Agent, or Firm* — Kenyon & Kenyon LLP

(57) ABSTRACT

A cooler is provided which includes a heat discharging unit in which a plurality of heat discharge fins are placed in a line and a coolant flows in a passage between the heat discharge fins, an inflow-side coolant reservoir provided extending in a lined direction of the heat discharge fins and connected to a side of one end of the passage between the heat discharge fins through a first diaphragm portion, and an outflow-side coolant reservoir provided extending in the lined direction of the heat discharge fins and connected to a side of the other end of the passage between the heat discharge fins through a second diaphragm portion. An inflow-side fin is formed on a surface of the inflow-side coolant reservoir opposing the first diaphragm portion, and a circulation cross-sectional area of the inflow-side coolant reservoir is set smaller than a circulation cross-sectional area of the outflow-side coolant reservoir.

7 Claims, 4 Drawing Sheets

(56) References Cited

U.S. PATENT DOCUMENTS

2008/0196875 A1\* 8/2008 Kurtz et al. ................... 165/167
2010/0252235 A1\* 10/2010 Mori et al. ............... 165/104.19

FOREIGN PATENT DOCUMENTS

| JP | 2008-172024 A | 7/2008 |
| JP | 2012-146759 A | 8/2012 |

\* cited by examiner

COOLER

This is a 371 national phase application of PCT/JP2010/073340 filed 24 Dec. 2010, the contents of which are incorporated herein by reference.

TECHNICAL FIELD

The present invention relates to a cooler, and in particular, to an improvement of a flow rate of a coolant.

BACKGROUND ART

Conventionally, for a drive device having a motor, a drive device casing which stores the motor, and an inverter which controls the motor, a structure is proposed having a cooling structure for cooling the inverter and the motor.

FIGS. 6, 7, and 8 show a cooler structure of a related art disclosed in Patent Literature 1 described below. FIG. 6 is an overall perspective view of the cooling structure, FIG. 7 is a vertical cross sectional diagram of the cooling structure, and FIG. 8 is a vertical cross sectional diagram of primary portions of the cooling structure. Heat discharged by a heat discharging structure such as an inverter 3 and a motor 1 is discharged to a coolant which circulates in a coolant circulation path 4 between the heat discharging structure and a radiator 42, to thermally protect the heat discharging structure.

The inverter 4 comprises a switching transistor which converts a direct current power of a battery power supply into an alternating current power and associated circuit elements, and a circuit board on which the switching transistor and the circuit elements are placed. The inverter 3 is mounted on an upper surface side of the board itself or a heat sink 53 integrated with the board by attaching a separate member on the board, and the heat sink 53 is fixed on a bottom portion of an inverter casing 7 which stores the inverter 3. A lower surface of the heat sink 53 is formed as a heat discharging surface 53a thermally connected with the inverter 3. The inverter casing 7 is formed to cover and protect the inverter 3 placed therein from rainwater and dust.

The motor 1 is stored in the drive device casing 2, and a spacer member 6 is provided on an upper surface of the drive device casing 2. An opposing surface 6a which is placed opposing the heat discharging surface 53a and which is thermally connected with the motor 1 is formed on an upper surface of the spacer member 6. On the upper surface of the spacer element 6, a rectangular recess is formed for forming a coolant space R between the upper surface of the spacer member 6 and the lower surface of the heat sink 53, that is, the heat discharging surface 53a, in a state where the heat sink 53 is mounted on the spacer member 6. A bottom surface of the recess forms the opposing surface 6a. On a lower surface of the spacer member 6, a recess 61 which cooperates with the upper surface of the drive device casing 2 to form an inflow-side coolant path Ri and a recess 62 which cooperates with the upper surface of the drive device casing 2 to form an outflow-side coolant path Ro are formed parallel to each other.

The cooling structure is formed by forming a coolant space R between the heat discharging surface 53a of the heat sink 53 and the opposing surface 6a of the spacer member 6, providing a plurality of heat discharge fins 56 placed in a standing manner and parallel to each other in the coolant space R from the heat discharging surface 53a toward the opposing surface 6a, and forming an inter-fin passage Rp through which coolant flows between adjacent ones of the plurality of heat discharge fins 56. The heat discharge fin 56 extends in the coolant space R from the heat discharging surface 53a on the side of the heat sink 53 toward the opposing surface 6a of the spacer member 6, in order to retain a heat exchange area, and laterally crosses across the coolant space R in its thickness direction.

The heat discharge fin 56 is formed by machining a lower side of the heat sink 53, and the heat discharging surface 53a is formed close to the side of the inverter 3. In the placement of the fin 56 in standing manner, a length of a tip of the heat discharge fin 56 is set shorter than a length of the base end in relation to a site where the fin 56 is placed in a standing manner from a surface before the machining, and an end surface of the inter-fin passage Rp is inclined with respect to the direction of standing of the heat discharge fin 56.

With the recess 61 of the spacer member 6 and the upper surface of the drive device casing 2, the inflow-side coolant reservoir Ri is formed extending in a lined direction of the inter-fin passage Rp, and with the recess 62 of the spacer member 6 and the upper surface of the drive device casing 2, the outflow-side coolant reservoir Ro is formed extending in the lined direction of the inter-fin passage Rp. The inflow-side coolant reservoir Ri and one end of the inter-fin passage Rp are connected and coupled by a diaphragm portion Rs extending in a lined region of the inter-fin passage Rp, and the outflow-side coolant reservoir Ro and the other end of the inter-fin passage Rp are connected and coupled by a diaphragm portion Rs extending in the lined region of the inter-fin passage Rp.

On positions of the drive device casing 2 opposing the recesses 61 and 62, fins 21 are provided in a standing manner toward the inflow-side coolant reservoir Ri and the outflow-side coolant reservoir Ro, to increase a heat transfer area.

On a side end of one side of the spacer member 6, an inflow-side port 51 for allowing coolant to flow into the inflow-side coolant reservoir Ri and an outflow-side port 52 for allowing the coolant to flow out from the outflow-side coolant reservoir Ro are connected parallel to each other. With a coolant pump 41 provided in the coolant circulation path, the coolant supplied to the inflow-side coolant reservoir Ri is passed through the plurality of inter-fin passages Rp placed parallel to each other through the diaphragm portion Rs, to cool the inverter 3 through the heat discharging surface 53a. The coolant after the cooling of the inverter 3 flows out to the outflow-side coolant reservoir Ro through the diaphragm portion Rs.

RELATED ART REFERENCES

Patent Literature

[Patent Literature 1] JP 2008-172024 A

DISCLOSURE OF INVENTION

Technical Problem

A structure is employed in which the coolant supplied to the inflow-side coolant reservoir Ri flows through the inter-fin passage Rp through the diaphragm portion Rs. However, a fin 21 is placed in a standing manner in the inflow-side coolant reservoir Ri, and because of this, the coolant supplied to the inflow-side coolant reservoir Ri selectively flows in a space existing between the fin 21 and the diaphragm portion Rs, and the flow rate of the coolant to the bottom of the fin 21 is relatively reduced, causing a problem in that the cooling capability is reduced.

An advantage of the present invention is that cooling capability in the inflow-side coolant reservoir is improved in a cooler in which the inflow-side coolant reservoir and the outflow-side coolant reservoir are connected through the diaphragm portion in the coolant passage of the heat discharging surface.

Solution to Problem

According to one aspect of the present invention, there is provided a cooler comprising a heat discharging unit in which a plurality of heat discharge fins are placed in a line and a coolant flows through a passage between the heat discharge fins, an inflow-side coolant reservoir provided extending in a lined direction of the heat discharge fins and connected to a side of one end of the passage between the heat discharge fins through a first diaphragm portion, and an outflow-side coolant reservoir provided extending in the lined direction of the heat discharge fins and connected to a side of the other end of the passage between the heat discharge fins through a second diaphragm portion, wherein the coolant supplied to the inflow-side coolant reservoir flows to the passage between the heat discharge fins through the first diaphragm portion and flows out to the outflow-side coolant reservoir through the second diaphragm portion, an inflow-side fin is formed on a surface of the inflow-side coolant reservoir opposing the first diaphragm portion, and a circulation cross sectional area of the inflow-side coolant reservoir is set smaller than a circulation cross sectional area of the outflow-side coolant reservoir.

According to another aspect of the present invention, preferably, in the cooler, a circulation resistance of the inflow-side coolant reservoir, a circulation resistance of the outflow-side coolant reservoir, and circulation resistances of the first and second diaphragm portions satisfy a relationship of (circulation resistances of the first and second diaphragm portions)> (circulation resistance of the outflow-side coolant reservoir) >(circulation resistance of the inflow-side coolant reservoir).

According to another aspect of the present invention, preferably, in the cooler, the inflow-side fin is a non-oriented fin.

According to another aspect of the present invention, preferably, in the cooler, the non-oriented fin is a pin fin.

According to another aspect of the present invention, preferably, in the cooler, the pin fin is formed in a standing manner and not reaching a surface on which the first diaphragm portion is formed.

According to another aspect of the present invention, preferably, in the cooler, the pin fin is formed in a standing manner and reaching a surface on which the first diaphragm portion is formed.

According to another aspect of the present invention, preferably, in the cooler, an outflow-side fin is formed on a surface of the outflow-side coolant reservoir opposing the second diaphragm portion, and each of the inflow-side fin and the outflow-side fin is a non-oriented fin.

Advantageous Effects of Invention

According to various aspects of the present invention, the flow velocity of the coolant in the inflow-side coolant reservoir is increased, the coolant is supplied also to the inflow-side fin of the inflow-side coolant reservoir, and the cooling capability of the inflow-side coolant reservoir can be improved compared to the related art.

BEST MODE FOR CARRYING OUT THE INVENTION

Preferred embodiments of the present invention will now be described with reference to the drawings. The preferred embodiments described below are merely exemplary, and the present invention is not limited to the embodiments described below.

1. First Preferred Embodiment

Figure 6:
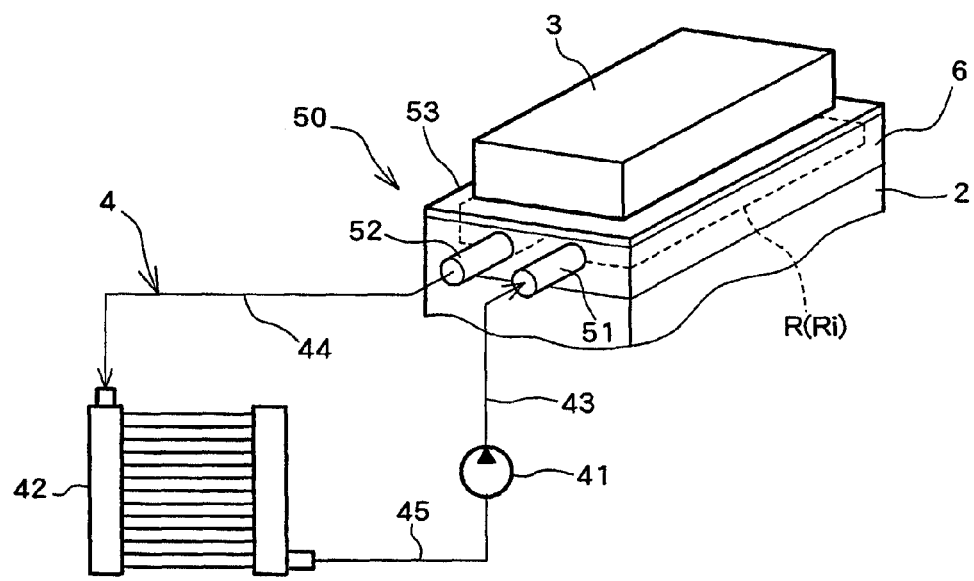
FIG. 6 is a perspective diagram of a cooling structure of related art.
Figure 7:
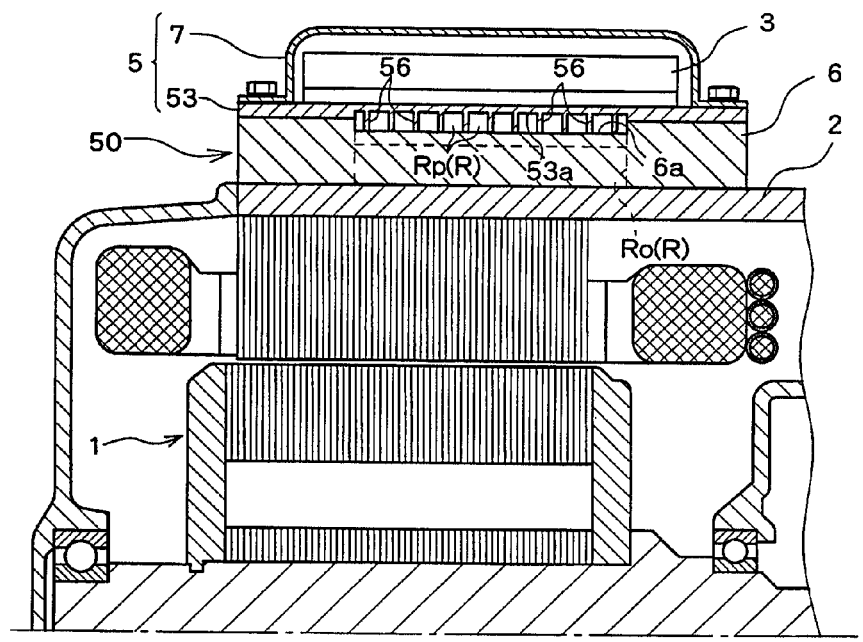
FIG. 7 is a vertical cross sectional diagram of the cooling structure of the related art.
Figure 8:
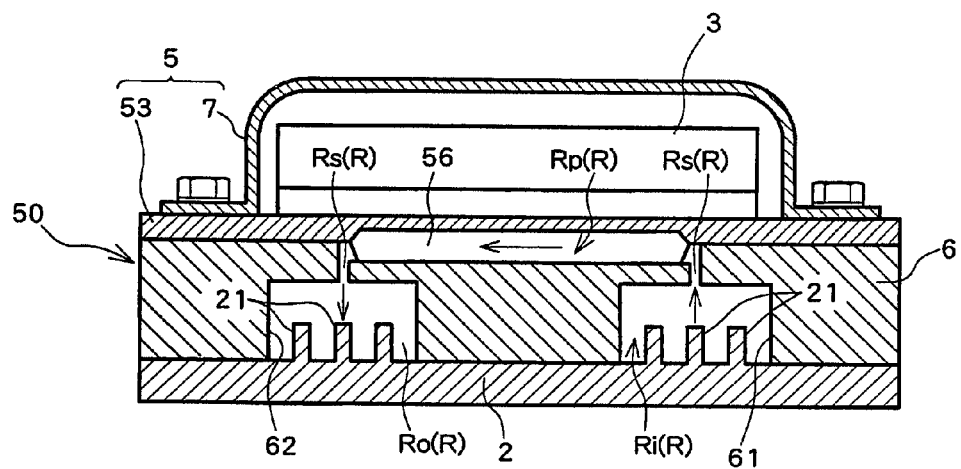
FIG. 8 is a vertical cross sectional diagram of primary portions of the cooling structure of the related art.

An overall structure of a cooler according to the present embodiment is approximately identical to the cooling structure of the related art shown in FIGS. 6-8. Specifically, the cooling structure is formed by forming a coolant space R between a heat discharging surface 53a of a heat sink 53 and an opposing surface 6a of a spacer member 6, placing a plurality of heat discharge fins 56 placed in a standing manner and parallel to each other in the coolant space R from the heat discharging surface 53a toward the opposing surface 6a, and forming an inter-fin passage Rp, through which the coolant flows, between adjacent ones of the plurality of heat discharge fins 56. The heat discharge fin 56 extends in the coolant space R from the heat discharging surface 53a on the side of the heat sink 53 toward the opposing surface 6a of the spacer member 6 in order to retain a heat exchange area, and crosses across the coolant space R in its thickness direction.

With a recess 61 of the spacer member 6 and an upper surface of a drive device casing 2, an inflow-side coolant reservoir Ri is formed extending in the lined direction of the inter-fin passages Rp. Similarly, with a recess 62 of the spacer member 6 and the upper surface of the drive device casing 2, an outflow-side coolant reservoir Ro is formed extending in the lined direction of the inter-fin passages Rp. The inflow-side coolant reservoir Ri and one end of the inter-fin passage Rp are connected and coupled by a diaphragm portion (first diaphragm portion) Rs extending in the lined region of the inter-fin passages Rp, and the outflow-side coolant reservoir Ro and the other end of the inter-fin passage Rp are connected and coupled by a diaphragm portion (second diaphragm portion) Rs extending in the lined region of the inter-fin passages Rp. At positions of the drive device casing 2 opposing the recesses 61 and 62, fins 21 are placed in a standing manner toward the inflow-side coolant reservoir Ri and the outflow-side coolant reservoir Ro, to increase a heat transfer area.

On a side end of on one side of the spacer member 6, an inflow-side port 51 for allowing the coolant to flow into the inflow-side coolant reservoir Ri and an outflow-side port 52 for allowing the coolant to flow out from the outflow-side coolant reservoir Ro are connected parallel to each other.

With a coolant pump 41 provided in the coolant circulation path, the coolant supplied to the inflow-side coolant reservoir Ri is passed to the plurality of inter-fin passages Rp placed parallel to each other through the diaphragm portion Rs, to cool the inverter 3 through the heat discharging surface 53a. The coolant after the cooling of the inverter 3 flows out to the outflow-side coolant reservoir Ro through the diaphragm portion Rs.

A difference from the cooling structure of the related art is in circulation cross sectional areas of the inflow-side coolant reservoir Ri and the outflow-side coolant reservoir Ro. Specifically, while in the related art the circulation cross sectional areas of the inflow-side coolant reservoir Ri and the outflow-side coolant reservoir Ro are identical to each other, in the present embodiment, the circulation cross sectional area of the inflow-side coolant reservoir Ri is set smaller, to satisfy a relationship:

(circulation cross sectional area of the inflow-side coolant reservoir Ri)<(circulation cross sectional area of the outflow-side coolant reservoir Ro)

Figure 1:
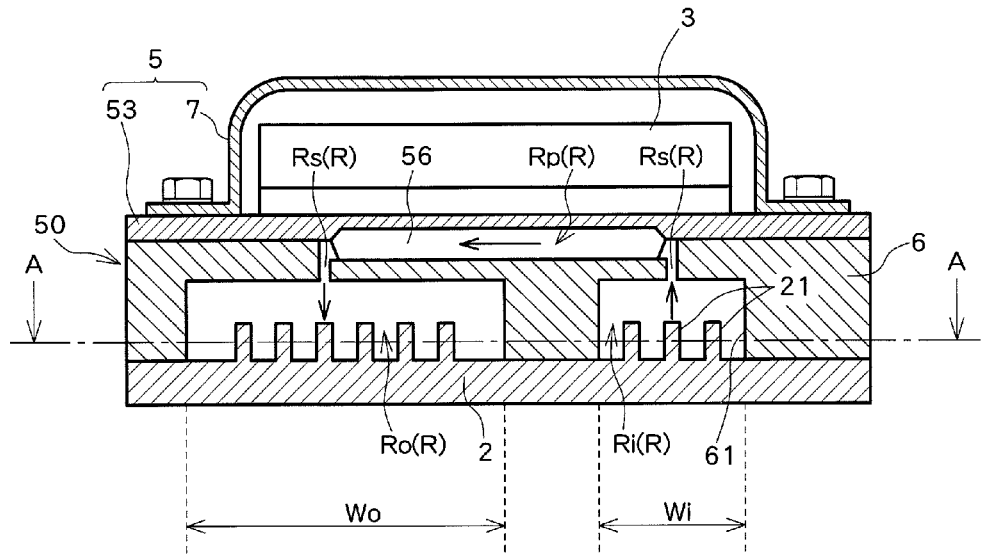
FIG. 1 is a vertical cross sectional diagram of a cooler according to a first preferred embodiment of the present invention.
Figure 2:
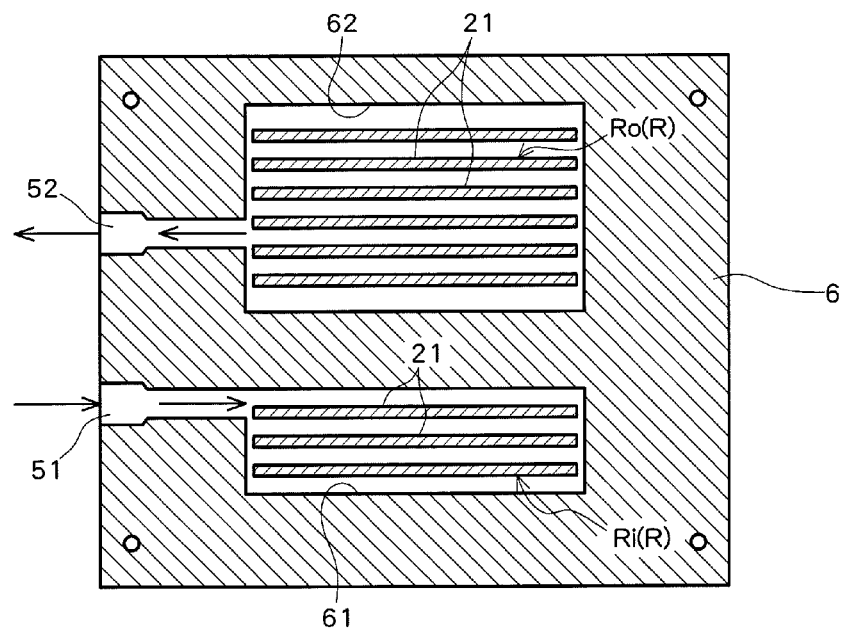
FIG. 2 is a lateral cross sectional diagram of the cooler according to the first preferred embodiment of the present invention, and shows an A-A cross section of FIG. 1.

FIG. 1 is a vertical cross sectional diagram of a cooler 50 in the present embodiment. FIG. 1 corresponds to FIG. 8 which shows the cooling structure of the related art. FIG. 2 is a lateral cross sectional diagram crossing across the inflow-side coolant reservoir Ri and the outflow-side coolant reservoir Ro, that is, an A-A cross sectional diagram of FIG. 1. As described above, with the recess 61 of the spacer member 6 and the upper surface of the drive device casing 2, the inflow-side coolant reservoir Ri is formed extending in the lined direction of the inter-fin passages Rp. In addition, with the recess 62 of the spacer member 6 and the upper surface of the drive device casing 2, the outflow-side coolant reservoir Ro is formed extending in the lined direction of the inter-fin passages Rp.

The inflow-side coolant reservoir Ri and one end of the inter-fin passage Rp are connected and coupled by a diaphragm portion Rs extending in the lined region of the inter-fin passages Rp. Similarly, the outflow-side coolant reservoir Ro and the other end of the inter-fin passage Rp are connected and coupled by a diaphragm portion Rs extending in the lined region of the inter-fin passages Rp. Fins 21 are placed in a standing manner within the inflow-side coolant reservoir Ri and the outflow-side coolant reservoir Ro. The coolant supplied to the inflow-side coolant reservoir Ri is passed to the plurality of inter-fin passages Rp placed parallel to each other through the diaphragm portion Rs, and the coolant after the cooling of the inverter 3 flows out to the outflow-side coolant reservoir Ro through the diaphragm portion Rs.

Because the diaphragm portion Rs extends above the inflow-side coolant reservoir Ri, the coolant flows into the inter-fin passage Rp after the inflow-side coolant reservoir Ri is filled with the coolant. In addition, because the outflow-side coolant reservoir Ro is positioned below the diaphragm portion Rs, the reverse flow of the coolant can be prevented.

In such a structure, as shown in FIGS. 1 and 2, a circulation width Wi of the inflow-side coolant reservoir Ri is smaller than a circulation width Wo of the outflow-side coolant reservoir, and a circulation cross sectional area of the inflow-side coolant reservoir Ri is smaller than a circulation cross sectional area of the outflow-side coolant reservoir Ro. For example, a ratio between the circulation width Wi of the inflow-side coolant reservoir Ri and the circulation width Wo of the outflow-side coolant reservoir is set Wi:Wo=1:2, and a ratio between the circulation cross sectional area of the inflow-side coolant reservoir Ri and a circulation cross sectional area of the outflow-side coolant reservoir Ro is set to 1:4. In comparison to the related art, if the circulation cross sectional areas of the inflow-side coolant reservoir Ri and the outflow-side coolant reservoir Ro in the cooling structure of the related art are 400 $mm^2$ and the circulation cross sectional area of the diaphragm portion Rs is 500 $mm^2$, in the present embodiment, the circulation cross sectional areas of the outflow-side coolant reservoir Ro and the diaphragm Rs are respectively maintained, and the circulation cross sectional area of the inflow-side coolant reservoir Ri is set smaller than the related art, such as 100 $mm^2$ or 200 $mm^2$. With regard to the circulation resistances of the inflow-side coolant reservoir Ri, the outflow-side coolant reservoir Ro, and the diaphragm Rs, in the cooling structure of the related art, the following relationship holds:

(circulation resistance of the diaphragm portion Rs)>(circulation resistance of the inflow-side coolant reservoir Ri)=(circulation resistance of the outflow-side coolant reservoir Ro)

On the other hand, in the present embodiment, the following relationship holds:

(circulation resistance of the diaphragm portion Rs)>(circulation resistance of the outflow-side coolant reservoir Ro)>(circulation resistance of the inflow-side coolant reservoir Ri)

With the setting of the circulation cross sectional area of the inflow-side coolant reservoir Ri at a smaller value, the flow velocity, in the inflow-side coolant reservoir, of the coolant supplied from the coolant circulation path to the inflow-side coolant reservoir Ri is correspondingly increased, and the reduction of the flow rate of the coolant by the provision of the fin 21 can be compensated for. With such a configuration, the cooling capability of the bottom of the fin 21 is improved. That is, the cooling capability of the drive device casing 2 is improved.

2. Second Preferred Embodiment

In the first preferred embodiment of the present invention, the fin 21 is provided in a standing manner in the inflow-side coolant reservoir Ri and the outflow-side coolant reservoir Ro. Alternatively, in place of the fin 21 in the inflow-side coolant reservoir Ri, a non-oriented fin 22 may be provided in a standing manner.

Figure 3:
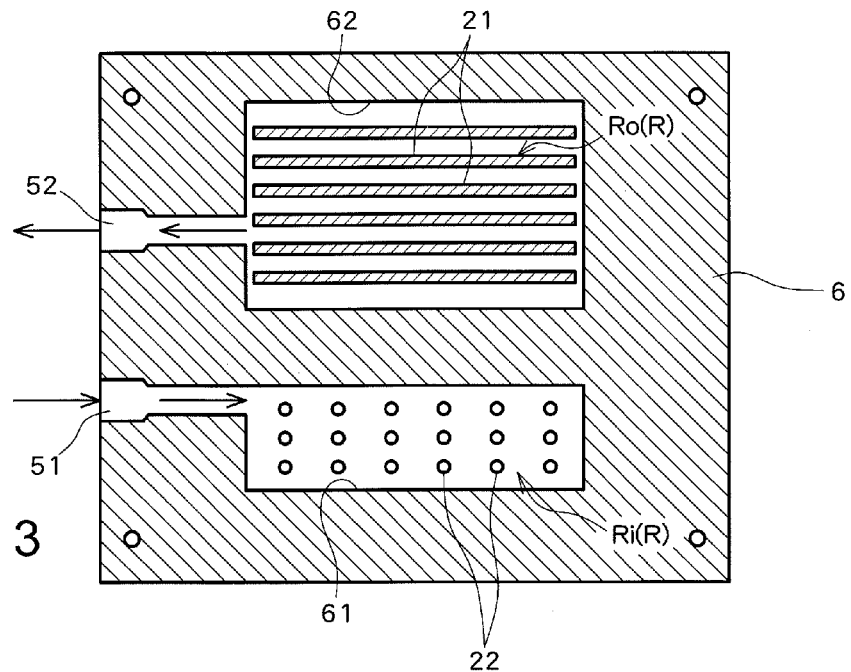
FIG. 3 is a lateral cross sectional diagram of a cooler according to a second preferred embodiment of the present invention.

FIG. 3 is a lateral cross sectional diagram of a cooler according to the present embodiment. A circulation cross sectional area of the inflow-side coolant reservoir Ri is set smaller than a circulation cross sectional area of the outflow-side coolant reservoir Ro, and a pin fin 22 serving as a non-oriented fin is placed in a standing manner in place of the fin 21 in the inflow-side coolant reservoir Ri. In the outflow-side coolant reservoir Ro, the fin 21 is placed in a standing manner similar to the first preferred embodiment of the present invention.

By employing the pin fin 22 for the fin in the inflow-side coolant reservoir Ri, a heat transfer area can be increased, and even if the pin fin 22 is further extended in the direction of the diaphragm portion Rs to fill the space between the pin fin 22 and the diaphragm portion Rs, the coolant can flow to the inter-fin passage Rp through the diaphragm portion Rs. In addition, the flow of the coolant selectively concentrated in the space portion when the fin 21 is provided in a stranding manner can also be directed to the bottom of the pin fin 22, and thus the cooling capability of the drive device casing 2 can be further improved.

3. Third Preferred Embodiment

In the second preferred embodiment of the present invention, the non-oriented pin fin 22 is employed as the fin in the inflow-side coolant reservoir Ri. In the present embodiment, the non-oriented fin is employed not only in the inflow-side coolant reservoir Ri, but also in the outflow-side coolant reservoir Ro.

Figure 4:
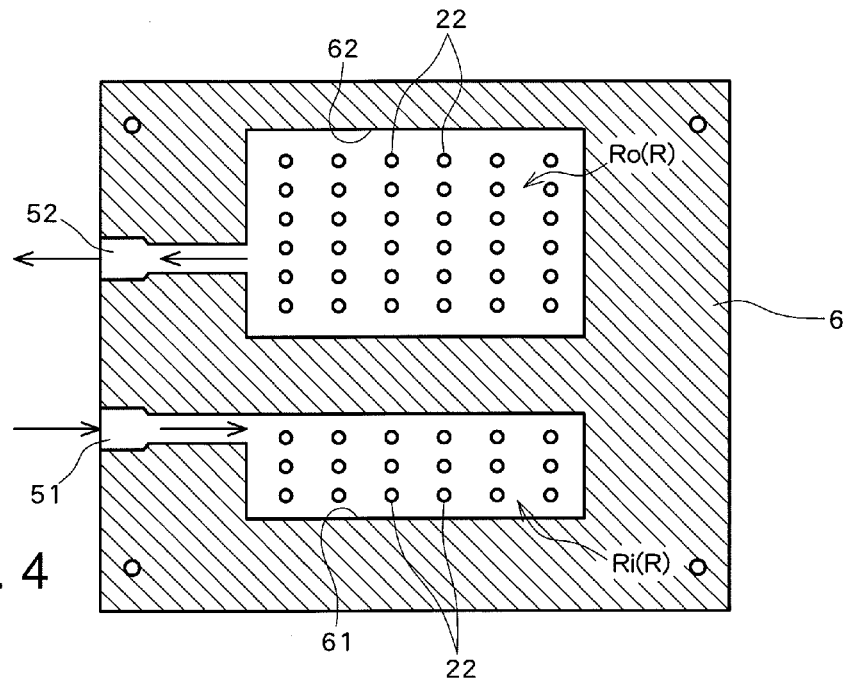
FIG. 4 is a lateral cross sectional diagram of a cooler according to a third preferred embodiment of the present invention.

FIG. 4 is a lateral cross sectional diagram of a cooler according to the present embodiment. A circulation cross sectional area of the inflow-side coolant reservoir Ri is set smaller than a circulation cross sectional area of the outflow-side coolant reservoir Ro, and a pin fin 22 serving as a non-oriented fin is placed in a standing manner in place of the fin 21 in the inflow-side coolant reservoir Ri and in the outflow-side coolant reservoir Ro.

With the employment of the pin fin 22 as the fin in the inflow-side coolant reservoir Ri, a heat transfer area can be increased, and even in a configuration in which the pin fin 22 is further extended in the direction of the diaphragm portion Rs to fill the space between the pin fin 22 and the diaphragm portion Rs, the coolant can flow to the inter-fin passage Rp through the diaphragm portion Rs. In addition, the flow of the coolant selectively concentrated in the space portion when the fin 21 is placed in a standing manner can also flow to the bottom of the pin fin 22, and thus the cooling capability of the drive device casing 2 can be further improved. In addition, with the pin fin 22 in the outflow-side coolant reservoir Ro, the flow of the coolant to the bottom of the pin fin 22 is further facilitated, and the cooling capability can be further improved.

4. Alternative Configuration

Preferred embodiments of the present invention have been described. The present invention, however, is not limited to the preferred embodiments, and other alternative configurations may be employed.

For example, in the embodiments, a structure is employed in which the cooler 50 cools the inverter 3 and also cools the drive device casing 2 which stores the motor 1, but alternatively, a structure may be employed in which motor drive units such as a DC-DC converter and a reactor are stored in the drive device casing 2, and the cooler 50 cools these drive units.

In addition, in the embodiments, the pin fin 22 is exemplified as the non-oriented fin, but the cross sectional shape of the pin fin 22 is not necessarily a circle as shown in FIG. 2 or 3, and other shapes, for example, an ellipse or a rhombus, may be employed.

Moreover, in the embodiments, the pin fin 22 serving as the non-oriented fin is placed in a standing manner only in the inflow-side coolant reservoir Ri or in the inflow-side coolant reservoir Ri and the in the outflow-side coolant reservoir Ro. Alternatively, the non-oriented fin may extend to reach the surface of the spacer member 6 on which the diaphragm portion Rs is formed or may extend partway and to not reach the surface of the spacer member 6.

Figure 5:
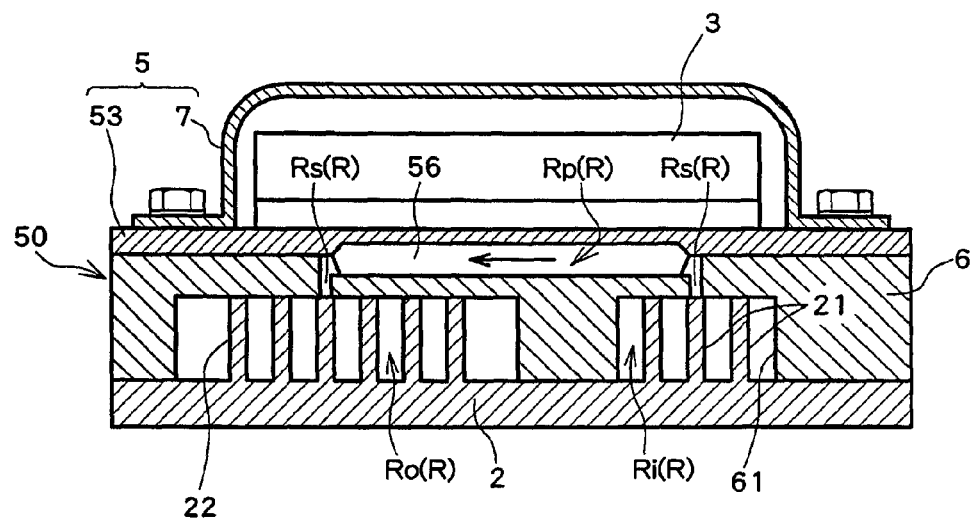
FIG. 5 is a vertical cross sectional diagram of a cooler according to another preferred embodiment of the present invention.

FIG. 5 shows a structure when the pin fin 22 serving as the non-oriented fin is extended to reach the surface of the spacer member 6. Similar to FIG. 1, a circulation cross sectional area of the inflow-side coolant reservoir Ri is set smaller than a circulation cross sectional area of the outflow-side coolant reservoir Ro. In addition, the pin fin 22 serving as the non-oriented fin is placed in a standing manner from the upper surface of the drive device casing 2 both in the inflow-side coolant reservoir Ri and in the outflow-side coolant reservoir Ro, and the pin fin 22 extends to reach the surface of the spacer member 6 on which the diaphragm portion Rs is formed, to fill the space between the diaphragm portion Rs and the fin 21 that existed in FIG. 1. Because the diaphragm portion Rs extends in the lined region of the inter-fin passages Rp, even when the pin fin 22 extends to reach the surface of the spacer member 6 as in the present configuration, the coolant can flow from the inflow-side coolant reservoir Ri to the inter-fin passage Rp through the diaphragm portion Rs, and flow out to the outflow-side coolant reservoir Ro from the inter-fin passage. According to such a configuration, because the surface area of the pin fin 22 is increased, the heat transfer area is further increased.

EXPLANATION OF REFERENCE NUMERALS

3 INVERTER; 21 FIN; 22 PIN FIN; 50 COOLER; 56 HEAT DISCHARGE FIN; Rp INTER-FIN PASSAGE; Ri INFLOW-SIDE COOLANT RESERVOIR; Ro OUTFLOW-SIDE COOLANT RESERVOIR; Rs DIAPHRAGM PORTION

The invention claimed is:

1. A cooler comprising:
a heat discharge unit in which a plurality of heat discharge fins are placed in a line and a coolant flows through a passage between the heat discharge fins;
an inflow-side coolant reservoir provided extending in a lined direction of the heat discharge fins and connected to a side of one end of the passage between the heat discharge fins through a first diaphragm portion; and
an outflow-side coolant reservoir provided extending in the lined direction of the heat discharge fins and connected to a side of the other end of the passage between the heat discharge fins through a second diaphragm portion,
wherein the coolant supplied to the inflow-side coolant reservoir flows to the passage between the heat discharge fins through the first diaphragm portion and flows out to the outflow-side coolant reservoir through the second diaphragm portion;
at least one inflow-side fin is formed in a standing manner on a surface of the inflow-side coolant reservoir opposing the first diaphragm portion,
at least one outflow-side fin is formed in the standing manner on a surface of the outflow-side coolant reservoir opposing the second diaphragm portion,
the circulation cross sectional area of the inflow-side coolant reservoir that includes the at least one inflow-side fin is smaller than a circulation cross sectional area of the outflow-side coolant reservoir that includes the at least one outflow-side fin, and
wherein a circulation resistance of the inflow-side coolant reservoir, a circulation resistance of the outflow-side coolant reservoir, and circulation resistances of the first and second diaphragm portions satisfy a relationship of: (circulation resistances of the first and second diaphragm portions)>(circulation resistance of the outflow-side coolant reservoir)>(circulation resistance of the inflow-side coolant reservoir).

2. The cooler according to claim 1, wherein the inflow-side fin is a non-oriented fin.

3. The cooler according to claim 2, wherein the non-oriented fin is a pin fin.

4. The cooler according to claim 3, wherein the pin fin is formed in a standing manner and not reaching a surface on which the first diaphragm portion is formed.

5. The cooler according to claim 3, wherein the pin fin is formed in a standing manner and reaching a surface on which the first diaphragm portion is formed.

6. The cooler according to claim 1, wherein each of the inflow-side fin and the outflow-side fin is a non-oriented fin.

7. The cooler according to claim 6, wherein the non-oriented fin is a pin fin.

* * * * *